United States Patent
Koshi et al.

(10) Patent No.: US 12,288,683 B2
(45) Date of Patent: Apr. 29, 2025

(54) METHOD OF MANUFACTURING SEMICONDUCTOR DEVICE, SUBSTRATE PROCESSING METHOD, NON-TRANSITORY COMPUTER-READABLE RECORDING MEDIUM AND SUBSTRATE PROCESSING APPARATUS

(71) Applicant: KOKUSAI ELECTRIC CORPORATION, Tokyo (JP)

(72) Inventors: Yasunobu Koshi, Toyama (JP); Kazuyuki Okuda, Toyama (JP); Yoshitomo Hashimoto, Toyama (JP); Katsuyoshi Harada, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 544 days.

(21) Appl. No.: 17/697,688

(22) Filed: Mar. 17, 2022

(65) Prior Publication Data
US 2022/0208544 A1 Jun. 30, 2022

Related U.S. Application Data

(63) Continuation of application No. PCT/JP2020/029951, filed on Aug. 5, 2020.

(30) Foreign Application Priority Data

Sep. 20, 2019 (JP) .................... 2019-171529

(51) Int. Cl.
*H01L 21/02* (2006.01)
*C23C 16/455* (2006.01)
(Continued)

(52) U.S. Cl.
CPC .... *H01L 21/0228* (2013.01); *C23C 16/45536* (2013.01); *C23C 16/45544* (2013.01);
(Continued)

(58) Field of Classification Search
CPC ............ H01L 21/0228; H01L 21/0217; H01L 21/02274; H01L 21/02211;
(Continued)

(56) References Cited

U.S. PATENT DOCUMENTS 9,583,338 B2 * 2/2017 Hashimoto ....... H01L 21/02211
10,229,829 B2 * 3/2019 Nakamura .......... C23C 16/4554
(Continued)

FOREIGN PATENT DOCUMENTS

CN       1841676 A     10/2006
JP     2013-093551 A    5/2013
(Continued)

OTHER PUBLICATIONS

Chinese Office Action issued on Sep. 19, 2023 for Chinese Patent Application No. 202080047973.4.
(Continued)

*Primary Examiner* — Jose R Diaz
(74) *Attorney, Agent, or Firm* — Volpe Koenig

(57) ABSTRACT

According to one aspect of a technique of the present disclosure, there is provided a method of manufacturing a semiconductor device, including: (A) forming a film containing a predetermined element and nitrogen on a substrate by performing a cycle a predetermined number of times, wherein the cycle includes: (a) forming a first layer by supplying a source gas containing the predetermined element and a halogen element to the substrate heated to a first temperature; (b) forming a second layer by modifying the first layer by supplying a plasma-excited first modification gas containing hydrogen free of nitrogen; and (c) forming a third layer by modifying the second layer by supplying a plasma-excited second modification gas containing nitrogen and hydrogen. A supply time $T_H$ of supplying the first (Continued)

modification gas in (b) is set to be longer than a supply time $T_N$ of supplying the second modification gas in (c).

14 Claims, 6 Drawing Sheets

(51) Int. Cl.
    *C23C 16/52*     (2006.01)
    *H01J 37/32*     (2006.01)

(52) U.S. Cl.
    CPC ........ *C23C 16/52* (2013.01); *H01J 37/32449* (2013.01); *H01J 37/32724* (2013.01); *H01J 37/32816* (2013.01); *H01L 21/0217* (2013.01); *H01L 21/02274* (2013.01); *H01J 2237/332* (2013.01)

(58) Field of Classification Search
    CPC .......... H01L 21/02219; H01J 37/32449; H01J 37/32724; H01J 37/32816; C23C 16/45536; C23C 16/45544; C23C 16/52; C23C 16/345; C23C 16/36; C23C 16/45527; C23C 16/455; C23C 16/34
    See application file for complete search history.

(56) References Cited

U.S. PATENT DOCUMENTS

| | | |
|---|---|---|
| 2006/0216418 A1 | 9/2006 | Matsuura |
| 2009/0280652 A1 | 11/2009 | Miya et al. |
| 2013/0171838 A1 | 7/2013 | Okuda |
| 2018/0342385 A1 | 11/2018 | Tonegawa |
| 2020/0312632 A1* | 10/2020 | Hara .................. C23C 16/4584 |

FOREIGN PATENT DOCUMENTS

| | | |
|---|---|---|
| JP | 2018-011009 A | 1/2018 |
| JP | 2018-198288 A | 12/2018 |
| TW | 201900919 A | 1/2019 |
| WO | 2006/088062 A1 | 8/2006 |

OTHER PUBLICATIONS

Taiwan Office Action dated Feb. 4, 2021 and English Translation, TW Appln. No. 01194/11020117510.

\* cited by examiner

FIG. 6

| EXAMPLE No. | $T_H$ (sec.) | $T_N$ (sec.) | $T_H / T_N$ RATIO | STRESS (GPa) |
|---|---|---|---|---|
| #1 | 50 | 20 | 2.5 | 0.624 |
| #2 | 70 | 20 | 3.5 | 0.521 |
| #3 | 110 | 20 | 5.5 | 0.504 |

FIG. 7

| EXAMPLE No. | $R_H$ (W) | $R_N$ (W) | $R_H / R_N$ RATIO | STRESS (GPa) |
|---|---|---|---|---|
| #4 | 50 | 100 | 0.5 | 0.624 |
| #5 | 100 | 100 | 1 | 0.577 |

METHOD OF MANUFACTURING SEMICONDUCTOR DEVICE, SUBSTRATE PROCESSING METHOD, NON-TRANSITORY COMPUTER-READABLE RECORDING MEDIUM AND SUBSTRATE PROCESSING APPARATUS

CROSS-REFERENCE TO RELATED PATENT APPLICATION

This application is a bypass continuation application of PCT International Application No. PCT/JP2020/029951, filed on Aug. 5, 2020, in the WIPO, the international application being based upon and claiming the benefit of priority from Japanese Patent Application No. 2019-171529, filed on Sep. 20, 2019, in the Japanese Patent Office, the entire contents of which are hereby incorporated by reference.

BACKGROUND

1. Field

The present disclosure relates to a method of manufacturing a semiconductor device, a substrate processing method, a non-transitory computer-readable recording medium and a substrate processing apparatus.

2. Related Art

As a part of a manufacturing process of a semiconductor device, a film-forming process of forming a film containing a predetermined element and nitrogen (hereinafter, also referred to as a "nitride film") on a heated substrate may be performed.

SUMMARY

According to the present disclosure, there is provided a technique capable of improving a quality of a nitride film formed on a substrate and reducing a stress generated in the nitride film after a film-forming process.

According to one or more embodiments of the present disclosure, there is provided a method of manufacturing a semiconductor device, including: (A) forming a film containing a predetermined element and nitrogen on a substrate by performing a cycle a predetermined number of times, wherein the cycle includes: (a) forming a first layer by supplying a source gas containing the predetermined element and a halogen element to the substrate heated to a first temperature in a process chamber; (b) forming a second layer by modifying the first layer by supplying a first modification gas containing hydrogen free of nitrogen and exited by plasma to the substrate in the process chamber; and (c) forming a third layer by modifying the second layer by supplying a second modification gas containing nitrogen and hydrogen and exited by plasma to the substrate in the process chamber, and wherein a supply time $T_H$ of supplying the first modification gas in (b) is set to be longer than a supply time $T_N$ of supplying the second modification gas in (c).

BRIEF DESCRIPTION OF THE DRAWINGS

FIG. 6 is a diagram schematically illustrating process conditions of first through third examples according to the embodiments of the present disclosure and measurement results of a stress of a film formed according to the first through third examples.

FIG. 7 is a diagram schematically illustrating process conditions of fourth through fifth examples according to the embodiments of the present disclosure and measurement results of a stress of a film formed according to the fourth through fifth examples.

DETAILED DESCRIPTION

Embodiments

Hereinafter, one or more embodiments (also simply referred to as "embodiments") according to the technique of the present disclosure will be described with reference to FIGS. 1 through 4.

(1) Configuration of Substrate Processing Apparatus

Figure 1:
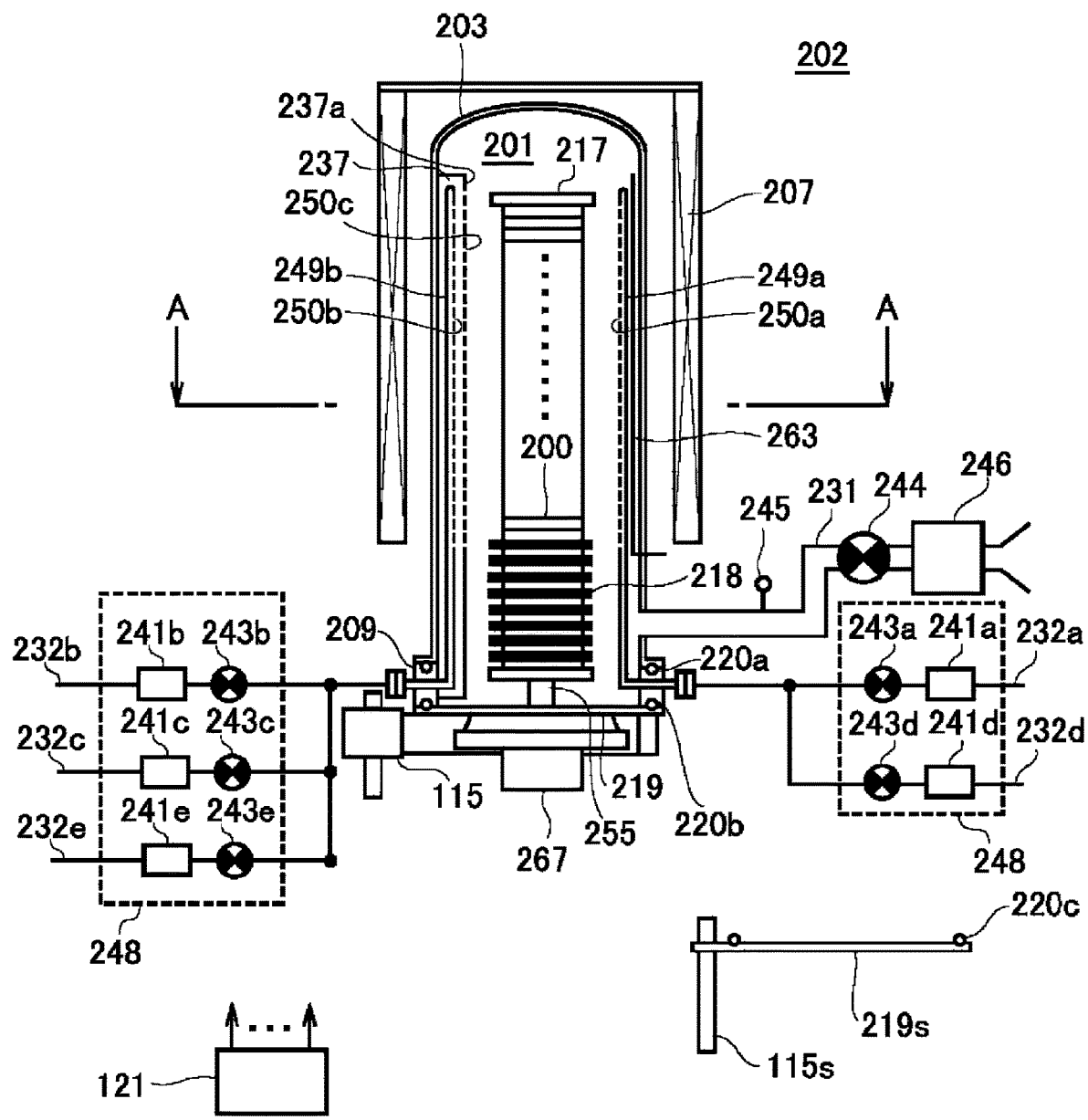
FIG. 1 is a diagram schematically illustrating a vertical cross-section of a vertical type process furnace of a substrate processing apparatus preferably used in one or more embodiments of the present disclosure.

As shown in FIG. 1, a substrate processing apparatus according to the present embodiments includes a process furnace 202. The process furnace 202 is provided with a heater 207 serving as a heating structure (heating system) or a temperature regulator. The heater 207 is of a cylindrical shape, and is vertically installed while being supported by a support plate (not shown). The heater 207 also functions as an activator (also referred to as an "exciter") capable of activating (exciting) a gas such as a process gas by a heat.

A reaction tube 203 is provided in an inner side of the heater 207 to be aligned in a manner concentric with the heater 207. For example, the reaction tube 203 is made of a heat resistant material such as quartz ($SiO_2$) and silicon carbide (SiC). The reaction tube 203 is of a cylindrical shape with a closed upper end and an open lower end. A manifold 209 is provided under the reaction tube 203 to be aligned in a manner concentric with the reaction tube 203. For example, the manifold 209 is made of a metal such as stainless steel (SUS). The manifold 209 is of a cylindrical shape with open upper and lower ends. The upper end of the manifold 209 is engaged with the lower end of the reaction tube 203 so as to support the reaction tube 203. An O-ring 220a serving as a seal is provided between the manifold 209 and the reaction tube 203. Similar to the heater 207, the reaction tube 203 is installed vertically. A process vessel (also referred to as a "reaction vessel") is constituted mainly by the reaction tube 203 and the manifold 209. A process chamber 201 is provided in a hollow cylindrical portion of the process vessel. The process chamber 201 is configured to accommodate a plurality of wafers including a wafer 200 serving as a substrate. Hereinafter, the plurality of wafers including the wafer 200 may also be simply referred to as "wafers 200".

Nozzles 249a and 249b are provided in the process chamber 201 so as to penetrate a side wall of the manifold 209. Gas supply pipes 232a and 232b are connected to the nozzles 249a and 249b, respectively.

Mass flow controllers (also simply referred to as "MFCs") 241a and 241b serving as flow rate controllers (flow rate control structures) and valves 243a and 243b serving as opening/closing valves are sequentially installed at the gas supply pipes 232a and 232b, respectively, in this order from upstream sides to downstream sides of the gas supply pipes 232a and 232b in a gas flow direction. A gas supply pipe 232d is connected to the gas supply pipe 232a at a downstream side of the valve 243a of the gas supply pipe 232a. Gas supply pipes 232c and 232e are connected to the gas supply pipe 232b at a downstream side of the valve 243b of the gas supply pipe 232b. MFCs 241c, 241d and 241e and valves 243c, 243d and 243e are sequentially installed at the gas supply pipes 232c, 232d and 232e, respectively, in this order from upstream sides to downstream sides of the gas supply pipes 232c, 232d and 232e in the gas flow direction.

Figure 2:
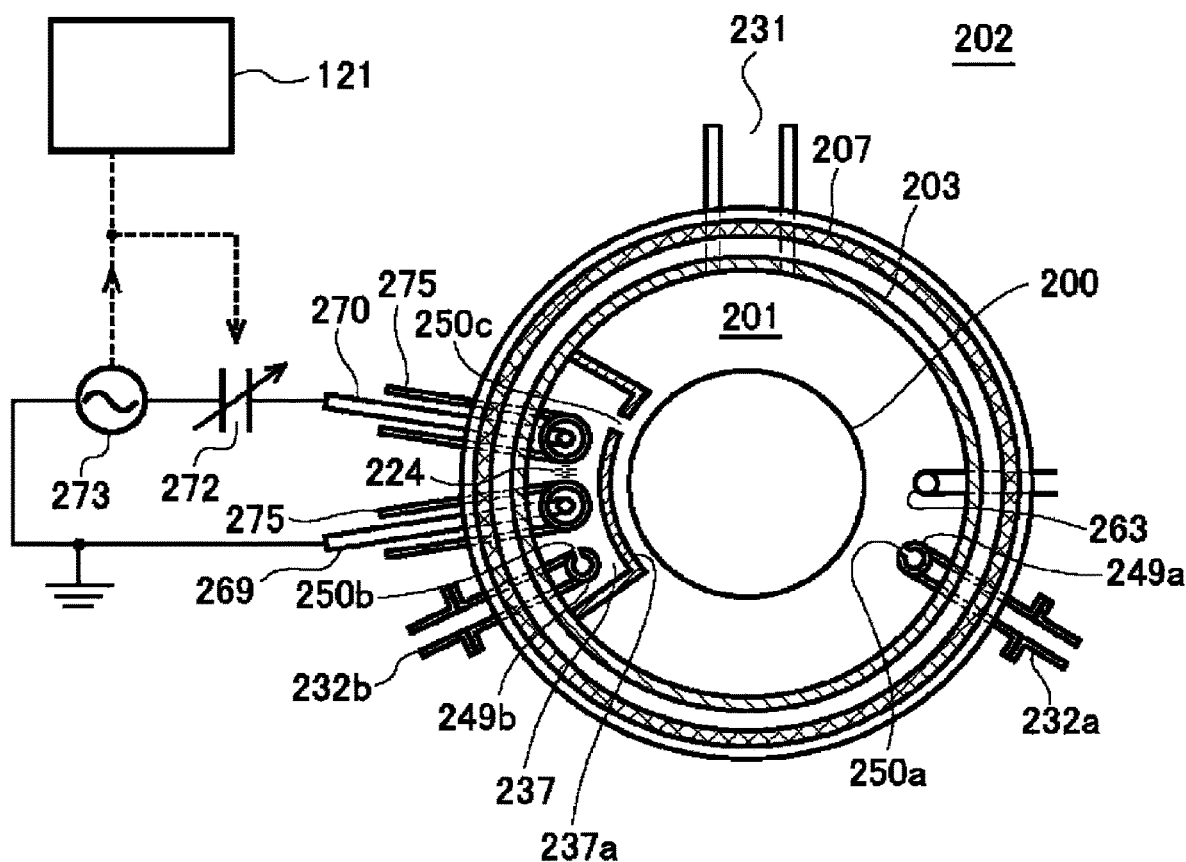
FIG. 2 is a diagram schematically illustrating a horizontal cross-section taken along the line A-A of the vertical type process furnace of the substrate processing apparatus preferably used in the embodiments of the present disclosure shown in FIG. 1.

As shown in FIG. 2, each of the nozzles 249a and 249b is installed in an annular space provided between an inner wall of the reaction tube 203 and the wafers 200 when viewed from above, and extends upward from a lower portion toward an upper portion of the reaction tube 203 along the inner wall of the reaction tube 203 (that is, extends upward along a stacking direction of the wafers 200). That is, each of the nozzles 249a and 249b is installed in a region that is located beside and horizontally surrounds the wafer arrangement region in which the wafers 200 are arranged (stacked) along the wafer arrangement region. A plurality of gas supply holes 250a and a plurality of gas supply holes 250b are provided at side surfaces of the nozzles 249a and 249b, respectively. Gases are supplied through the gas supply holes 250a and the gas supply holes 250b, respectively. The gas supply holes 250a are open toward a center of the reaction tube 203 such that a gas such as a source gas is supplied toward the wafers 200. The gas supply holes 250b are open toward a center of a buffer chamber 237 described later. The gas supply holes 250a and the gas supply holes 250b are provided from the lower portion toward the upper portion of the reaction tube 203.

The nozzle 249b is installed in the buffer chamber 237 serving as a gas dispersion space. The buffer chamber 237 is provided between the inner wall of the reaction tube 203 and a partition wall 237a. The buffer chamber 237 (partition wall 237a) is provided in the annular space provided between the inner wall of the reaction tube 203 and the wafers 200 when viewed from above and extends upward from the lower portion toward the upper portion of the reaction tube 203 along the inner wall of the reaction tube 203 (that is, extends upward along the stacking direction of the wafers 200). That is, the buffer chamber 237 (partition wall 237a) is installed in the region that is located beside and horizontally surrounds the wafer arrangement region in which the wafers 200 are arranged (stacked) along the wafer arrangement region. A plurality of gas supply holes 250c are provided at an end of a surface of the partition wall 237a facing the wafers 200 (that is, a surface of the partition wall 237a adjacent to the wafers 200). The gases are supplied through the gas supply holes 250c. The gas supply holes 250c are open toward the center of the reaction tube 203 such that the gases are supplied toward the wafers 200. The gas supply holes 250c are provided from the lower portion toward the upper portion of the reaction tube 203.

For example, the source gas is supplied into the process chamber 201 through the gas supply pipe 232a provided with the MFC 241a and the valve 243a and the nozzle 249a. As the source gas, a halosilane-based gas containing silicon (Si) serving as a main element (predetermined element) constituting a film to be formed and a halogen element may be used. For example, the source gas refers to a source in a gaseous state under a normal temperature and a normal pressure or a gas obtained by vaporizing a source in a liquid state under the normal temperature and the normal pressure. The halogen element includes an element such as chlorine (Cl), fluorine (F), bromine (Br) and iodine (I). The halosilane-based gas serves as a silicon source. As the halosilane-based gas, for example, a chlorosilane-based gas containing chlorine may be used. As the chlorosilane-based gas, for example, dichlorosilane ($SiH_2Cl_2$, abbreviated as DCS) gas may be used.

A first modification gas is supplied into the process chamber 201 through the gas supply pipe 232b provided with the MFC 241b and the valve 243b, the nozzle 249b and the buffer chamber 237. As the first modification gas, a gas containing hydrogen (H) and free of nitrogen (N) may be used. As the gas containing hydrogen and free of nitrogen, hydrogen ($H_2$) gas may be used.

A second modification gas is supplied into the process chamber 201 through the gas supply pipe 232c provided with the MFC 241c and the valve 243c, the gas supply pipe 232b, the nozzle 249b and the buffer chamber 237. As the second modification gas, a gas containing nitrogen and hydrogen may be used. As the gas containing nitrogen and hydrogen, for example, a hydrogen nitride-based gas may be used. As the hydrogen nitride-based gas, for example, ammonia ($NH_3$) gas may be used.

Nitrogen ($N_2$) gas is supplied into the process chamber 201 through the gas supply pipes 232d and 232e provided with the MFCs 241d and 241e and the valves 243d and 243e, respectively, the gas supply pipes 232a and 232b, the nozzles 249a and 249b and the buffer chamber 237. The $N_2$ gas serves as a purge gas or a carrier gas.

A source gas supplier (which is a source gas supply structure or a source gas supply system) is constituted mainly by the gas supply pipe 232a, the MFC 241a and the valve 243a. A hydrogen gas supplier (which is a hydrogen gas supply structure or a hydrogen gas supply system) is constituted mainly by the gas supply pipe 232b, the MFC 241b and the valve 243b. A hydrogen nitride-based gas supplier (which is a hydrogen nitride-based cleaning gas supply structure or a hydrogen nitride-based cleaning gas supply system) is constituted mainly by the gas supply pipe 232c, the MFC 241c and the valve 243c. A nitrogen gas supplier (which is a nitrogen gas supply structure or a nitrogen gas supply system) is constituted mainly by the gas supply pipes 232d and 232e, the MFCs 241d and 241e and the valves 243d and 243e.

Any one of the gas suppliers described above may be embodied as an integrated gas supply system 248 in which the components such as the MFCs 241a through 241d and the valves 243a through 243d are integrated. The integrated gas supply system 248 is connected to the respective gas supply pipes 232a through 232d. An operation of the integrated gas supply system 248 to supply various gases to the gas supply pipes 232a through 232d, for example, operations such as an operation of opening and closing the valves 243a through 243d and an operation of adjusting flow rates of the gases through the MFCs 241a through 241d may be controlled by a controller 121 which will be described later. The integrated gas supply system 248 may be embodied as an integrated structure (integrated unit) with an all-in-one type or a divided type. The integrated gas supply system 248 may be attached to or detached from the components such as the gas supply pipes 232a through 232d on a basis of the integrated structure. Operations such as maintenance, replacement and addition of the integrated gas supply system 248 may be performed on a basis of the integrated structure.

In the buffer chamber 237, two rod-shaped electrodes 269 and 270 made of a conductor and configured as a narrowly elongated structure extend upward from the lower portion toward the upper portion of the reaction tube 203 along the inner wall of the reaction tube 203 (that is, extends upward along the stacking direction of the wafers 200). Each of the rod-shaped electrodes 269 and 270 is provided parallel to the nozzle 249b. Each of the rod-shaped electrodes 269 and 270 is covered and protected by an electrode protecting pipe 275 from an upper portion to a lower portion thereof. One of the rod-shaped electrodes 269 and 270 is connected to a high frequency power supply 273 through a matcher 272 (which is a matching structure), and the other one of the rod-shaped electrodes 269 and 270 is connected to and grounded to the electrical ground serving as a reference potential. By applying high frequency power (that is, RF power) between the rod-shaped electrodes 269 and 270 from the high frequency power supply 273, the plasma is generated in a plasma generation region 224 between the rod-shaped electrodes 269 and 270. A plasma exciter (also referred to as a "plasma activator") capable of exciting (activating) the gases into a plasma state in the plasma generation region 224 is constituted mainly by the rod-shaped electrodes 269 and 270 and the electrode protecting pipe 275. The plasma exciter may also be referred to as a plasma generator. The plasma exciter may further include the matcher 272 and the high frequency power supply 273.

An exhaust pipe 231 through which an inner atmosphere of the process chamber 201 is exhausted is provided at a lower side wall of the reaction tube 203. A vacuum pump 246 serving as a vacuum exhaust apparatus is connected to the exhaust pipe 231 through a pressure sensor 245 and an APC (Automatic Pressure Controller) valve 244. The pressure sensor 245 serves as a pressure detector (pressure detection structure) to detect an inner pressure of the process chamber 201, and the APC valve 244 serves as a pressure regulator (pressure adjusting structure). With the vacuum pump 246 in operation, the APC valve 244 may be opened or closed to vacuum-exhaust the process chamber 201 or stop the vacuum exhaust. With the vacuum pump 246 in operation, the inner pressure of the process chamber 201 may be adjusted by adjusting an opening degree of the APC valve 244 based on pressure information detected by the pressure sensor 245. An exhauster (which is an exhaust structure or an exhaust system) is constituted mainly by the exhaust pipe 231, the APC valve 244 and the pressure sensor 245. The exhauster may further include the vacuum pump 246.

A seal cap 219 serving as a furnace opening lid capable of airtightly sealing (or closing) a lower end opening of the manifold 209 is provided under the manifold 209. An O-ring 220b serving as a seal is provided on an upper surface of the seal cap 219 so as to be in contact with the lower end of the manifold 209. A rotator 267 configured to rotate a boat 217 described later is provided under the seal cap 219. A rotating shaft 255 of the rotator 267 is connected to the boat 217 through the seal cap 219. As the rotator 267 rotates the boat 217, the wafers 200 accommodated in the boat 217 are rotated. The seal cap 219 is elevated or lowered in the vertical direction by a boat elevator 115 serving as an elevator provided outside the reaction tube 203. The boat elevator 115 serves as a transfer device (which is a transfer structure or a transfer system) that loads the boat 217 and the wafers 200 accommodated in the boat 217 into the process chamber 201 or unloads the boat 217 and the wafers 200 accommodated in the boat 217 out of the process chamber 201 by elevating or lowering the seal cap 219.

The boat 217 serving as a substrate retainer is configured such that the wafers 200 (for example, 25 wafers to 200 wafers) are accommodated (or supported) in the vertical direction in the boat 217 while the wafers 200 are horizontally oriented with their centers aligned with one another with a predetermined interval therebetween in a multistage manner. For example, the boat 217 is made of a heat resistant material such as quartz and SiC. For example, a plurality of heat insulation plates 218 are provided at a lower portion of the boat 217 in a multistage manner.

A temperature sensor 263 serving as a temperature detector is installed in the reaction tube 203. A state of electric conduction to the heater 207 is adjusted based on temperature information detected by the temperature sensor 263 such that a desired temperature distribution of an inner temperature of the process chamber 201 can be obtained. The temperature sensor 263 is provided along the inner wall of the reaction tube 203.

Figure 3:
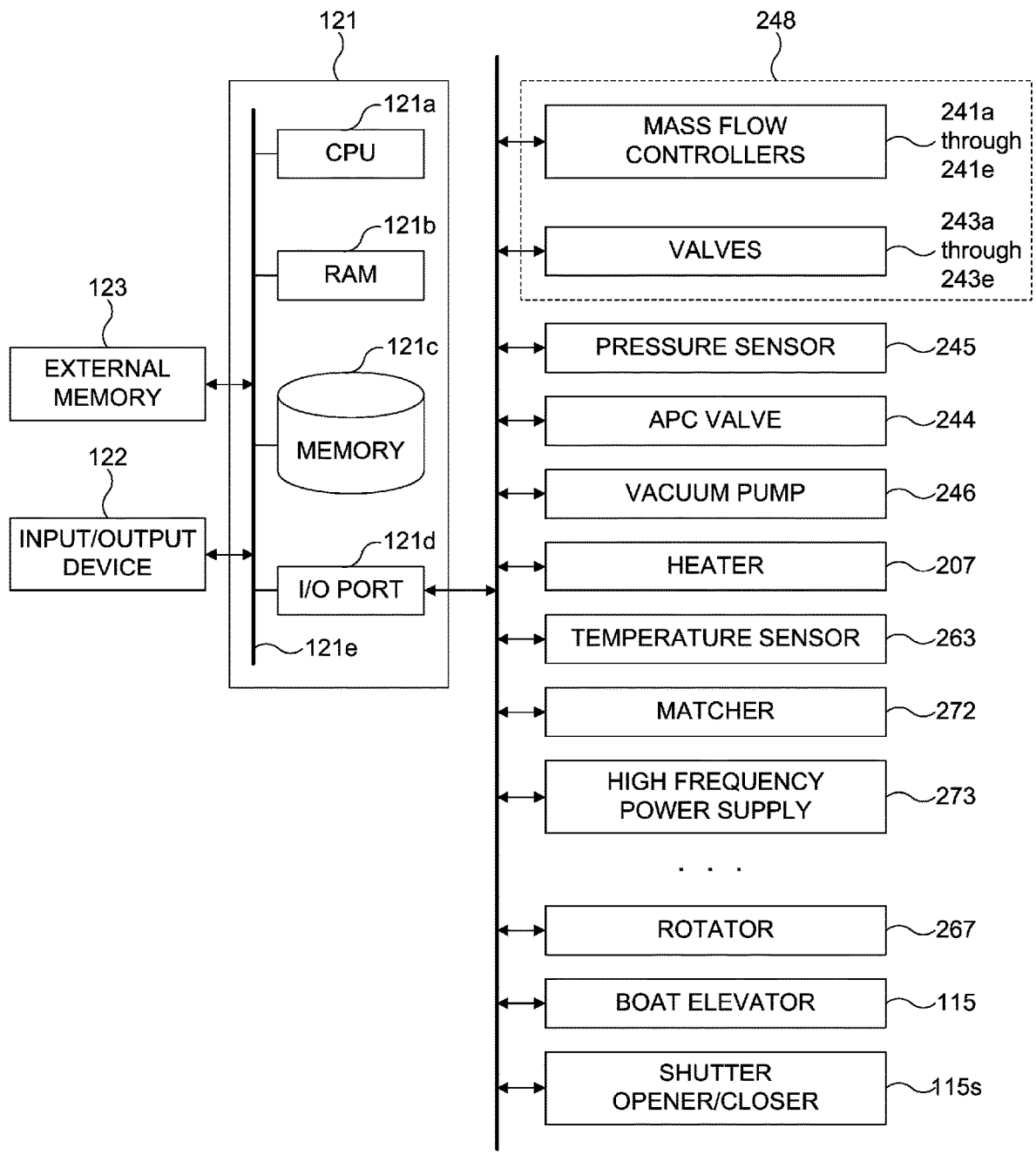
FIG. 3 is a block diagram schematically illustrating a configuration of a controller and related components of the substrate processing apparatus preferably used the embodiments of the present disclosure.

As shown in FIG. 3, the controller 121 serving as a control device (control structure) is constituted by a computer including a CPU (Central Processing Unit) 121a, a RAM (Random Access Memory) 121b, a memory 121c and an I/O port 121d. The RAM 121b, the memory 121c and the I/O port 121d may exchange data with the CPU 121a through an internal bus 121e. For example, an input/output device 122 constituted by a component such as a touch panel is connected to the controller 121.

The memory 121c is configured by a component such as a flash memory and a hard disk drive (HDD). For example, a control program configured to control the operation of the substrate processing apparatus or a process recipe containing information on sequences and conditions of a substrate processing such as a film-forming process described later is readably stored in the memory 121c. The process recipe is obtained by combining steps (sequences or processes) of the substrate processing described later such that the controller 121 can execute the steps to acquire a predetermined result, and functions as a program. Hereinafter, the process recipe and the control program may be collectively or individually referred to as a "program". In addition, the process recipe may also be simply referred to as a "recipe". Thus, in the present specification, the term "program" may refer to the recipe alone, may refer to the control program alone, or may refer to both of the recipe and the control program. The RAM 121b functions as a memory area (work area) where a program or data read by the CPU 121a is temporarily stored.

The I/O port 121d is connected to the components described above such as the MFCs 241a through 241e, the valves 243a through 243e, the pressure sensor 245, the APC valve 244, the vacuum pump 246, the temperature sensor 263, the heater 207, the rotator 267, the boat elevator 115, the matcher 272 and the high frequency power supply 273.

The CPU 121a is configured to read the control program from the memory 121c and execute the read control program. In addition, the CPU 121a is configured to read the recipe from the memory 121c in accordance with an operation command inputted from the input/output device 122. According to the contents of the read recipe, the CPU 121a may be configured to be capable of controlling various operations such as flow rate adjusting operations for various gases by the MFCs 241a through 241e, opening and closing operations of the valves 243a through 243e, an opening and closing operation of the APC valve 244, a pressure adjusting operation by the APC valve 244 based on the pressure sensor 245, a start and stop of the vacuum pump 246, a temperature adjusting operation by the heater 207 based on the temperature sensor 263, an operation of adjusting the rotation and the rotation speed of the boat 217 by the rotator 267, an elevating and lowering operation of the boat 217 by the boat elevator 115, an impedance adjusting operation by the matcher 272 and a power supply operation by the high frequency power supply 273.

The controller 121 may be embodied by installing the above-described program stored in an external memory 123 into a computer. For example, the external memory 123 may include a magnetic disk such as a hard disk drive (HDD), an optical disk such as a CD, a magneto-optical disk such as an MO and a semiconductor memory such as a USB memory. The memory 121c or the external memory 123 may be embodied by a non-transitory computer readable recording medium. Hereafter, the memory 121c and the external memory 123 may be collectively or individually referred to as a recording medium. Thus, in the present specification, the term "recording medium" may refer to the memory 121c alone, may refer to the external memory 123 alone, and may refer to both of the memory 121c and the external memory 123. Instead of the external memory 123, a communication means such as the Internet and a dedicated line may be used for providing the program to the computer.

(2) Substrate Processing (Film-Forming Process)

Hereinafter, an exemplary sequence of the substrate processing (film-forming process) of forming a silicon nitride film (also simply referred to as an "SiN film") on the wafer 200 serving as a substrate using the substrate processing apparatus described above will be described with reference to FIG. 4. The substrate processing is performed as a part of a manufacturing process of a semiconductor device. For example, a silicon (Si) wafer is used as the wafer 200. In the following descriptions, the operations of the components constituting the substrate processing apparatus are controlled by the controller 121.

Figure 4:
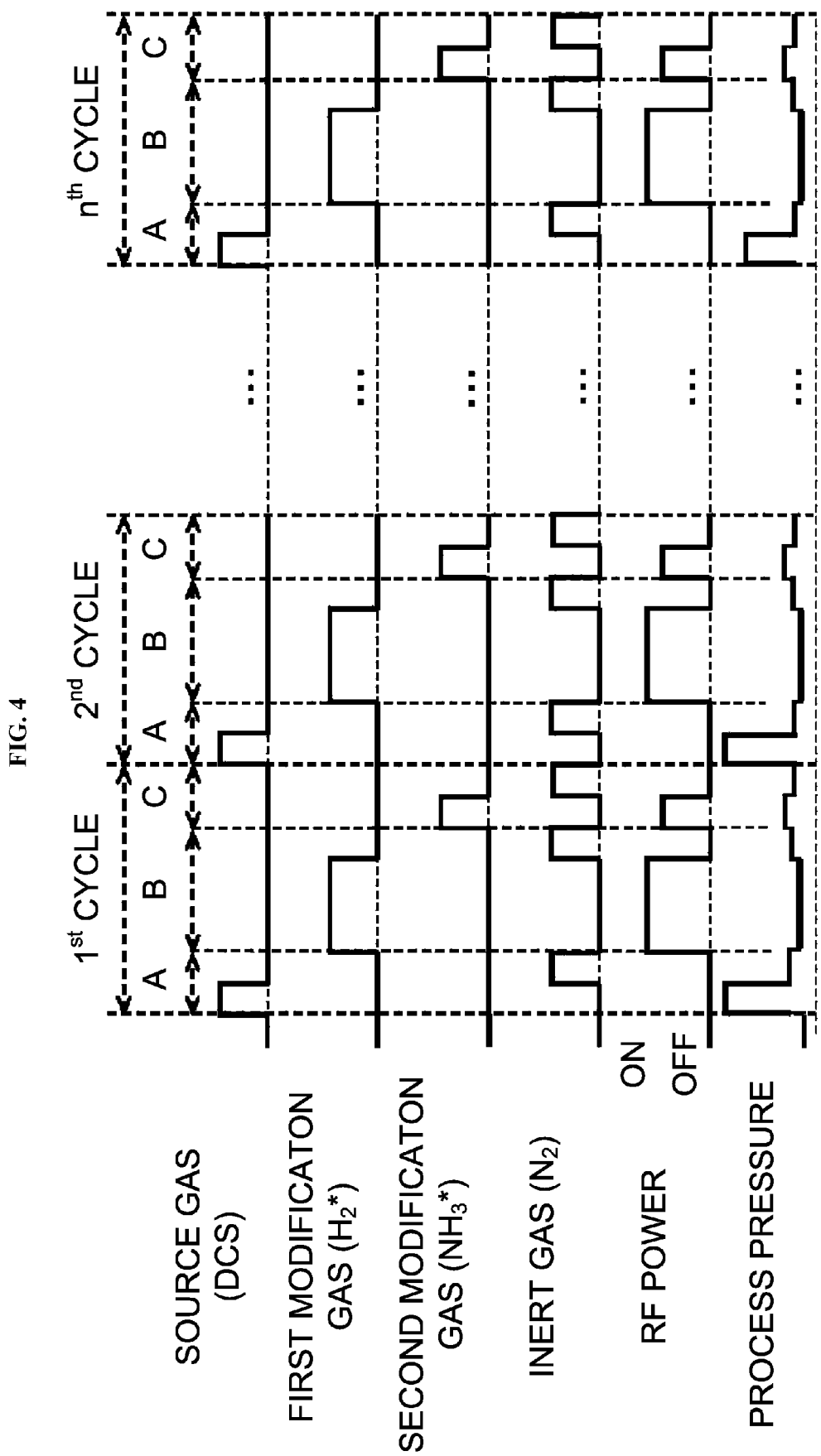
FIG. 4 is a diagram schematically illustrating a gas supply sequence in a film-forming sequence according to the embodiments of the present disclosure.

A gas supply sequence shown in FIG. 4 may include a film-forming step of forming the SiN film serving as a film containing silicon and nitrogen on the wafer 200 by performing a cycle a predetermined number of times (n times). For example, the cycle may include: (a) forming a first layer by supplying the DCS gas serving as the source gas to the wafer 200 heated to a first temperature in the process chamber 201 (that is, a step "A" shown in FIG. 4); (b) forming a second layer by modifying (shrinking) the first layer by supplying $H_2^*$ gas (which is the $H_2$ gas exited by the plasma as described later) serving as the first modification gas to the wafer 200 in the process chamber 201 (that is, a step "B" shown in FIG. 4); and (c) forming a third layer by modifying (nitriding) the second layer by supplying $NH_3^*$ gas (which is the $NH_3$ gas exited by the plasma as described later) serving as the second modification gas to the wafer 200 in the process chamber 201 (that is, a step "C" shown in FIG. 4). In the cycle, a supply time (which is a time duration) $T_H$ of supplying the $H_2^*$ gas in the step B is set to be longer than a supply time (which is a time duration) $T_N$ of supplying the $NH_3^*$ gas in the step C.

In the present specification, the gas supply sequence shown in FIG. 4 may be represented for simplicity's sake as follows. Gas supply sequences of other embodiments, which will be described later, will also be represented in the same manner.

$$(DCS \rightarrow H_2^* \rightarrow NH_3^*) \times n = \; > SiN$$

In the present specification, the term "wafer" may refer to "a wafer itself", or may refer to "a wafer and a stacked structure (aggregated structure) of a predetermined layer (or layers) or a film (or films) formed on a surface of the wafer". In the present specification, the term "a surface of a wafer" may refer to "a surface of a wafer itself", or may refer to "a surface of a predetermined layer or a film formed on a wafer". Thus, in the present specification, "forming a predetermined layer on a wafer" may refer to "forming a predetermined layer on a surface of a wafer itself", or may refer to "forming a predetermined layer on a surface of another layer or another film formed on a wafer". In the present specification, the terms "substrate" and "wafer" may be used as substantially the same meaning. That is, the term "substrate" may be substituted by "wafer" and vice versa.

<Wafer Charging Step and Boat Loading Step>

The wafers 200 are charged (transferred) into the boat 217 (wafer charging step). Then, as shown in FIG. 1, the boat 217 accommodating (or supporting) the wafers 200 is elevated by the boat elevator 115 and loaded (transferred) into the process chamber 201 (boat loading step). With the boat 217 loaded, the seal cap 219 airtightly seals the lower end of the manifold 209 via the O-ring 220b.

<Pressure Adjusting Step and Temperature Adjusting Step>

The vacuum pump 246 vacuum-exhausts (decompresses and exhausts) the inner atmosphere of the process chamber 201 such that the inner pressure of the process chamber 201 in which the wafers 200 are accommodated reaches and is maintained at a desired pressure (vacuum degree). When the vacuum pump 246 vacuum-exhausts the inner atmosphere of the process chamber 201, the inner pressure of the process chamber 201 is measured by the pressure sensor 245, and the APC valve 244 is feedback-controlled based on the pressure information detected by the pressure sensor 245 (pressure adjusting step). In addition, the heater 207 heats the process chamber 201 such that a temperature of the wafer 200 in the process chamber 201 reaches and is maintained at a desired process temperature. When the heater 207 heats the process chamber 201, the state of the electric conduction to the heater 207 is feedback-controlled based on the temperature information detected by the temperature sensor 263 such that a desired temperature distribution of the inner temperature of the process chamber 201 can be obtained (temperature elevating step). Further, the rotator 267 rotates the wafers 200 by rotating the boat 217. The vacuum pump 246 continuously vacuum-exhausts the inner atmosphere of the process chamber 201, the heater 207 continuously heats the wafer 200 in the process chamber 201 and the rotator 267 continuously rotates the wafers 200 until at least the processing of the wafer 200 is completed.

<Film-Forming Step>

Thereafter, the film-forming step is performed by sequentially performing the following three steps, that is, the step A, the step B and the step C.

<Step A>

In the step A, the DCS gas is supplied to the wafer 200 in the process chamber 201.

Specifically, the valve 243a is opened to supply the DCS gas into the gas supply pipe 232a. A flow rate of the DCS gas supplied into the gas supply pipe 232a is adjusted by the MFC 241a. Then, the DCS gas whose flow rate is adjusted is supplied into the process chamber 201 through the nozzle 249a, and is exhausted through the exhaust pipe 231. Thereby, the DCS gas is supplied to the wafer 200. When supplying the DCS gas, the $N_2$ gas may be supplied into the gas supply pipes 232d and 232e by opening the valves 243d and 243e. A flow rate of the $N_2$ gas supplied into the gas supply pipes 232d and 232e is adjusted by the MFCs 241d and 241e. Then, the $N_2$ gas whose flow rate is adjusted is supplied into the process chamber 201 through the nozzles 249a and 249b and the buffer chamber 237.

For example, process conditions of the step A are as follows:

A supply flow rate of the DCS gas: from 1 sccm to 2,000 sccm, preferably from 10 sccm to 1,000 sccm;

A supply flow rate of the $N_2$ gas (for each gas supply pipe): from 0 sccm to 20,000 sccm, preferably from 1,000 sccm to 10,000 sccm;

A supply time (time duration) of supplying each gas: from 1 second to 120 seconds, preferably from 1 second to 60 seconds;

A process temperature (first temperature): from 450° C. to 700° C., preferably from 450° C. to 550° C.; and A process pressure: from 1 Pa to 2,666 Pa, preferably from 67 Pa to 1,333 Pa.

By supplying the DCS gas to the wafer 200 according to the process conditions described above, a silicon-containing layer containing chlorine (Cl) is formed as the first layer on a surface of the wafer 200. The silicon-containing layer containing chlorine may be formed by chemical adsorption or physical adsorption of the DCS on the surface of the wafer 200, by chemical adsorption of a substance (hereinafter, referred to as "$SiH_xCl_y$") generated by decomposing a part of the DCS on the surface of the wafer 200, or by deposition of silicon generated by thermal decomposition of the DCS on the surface of the wafer 200. The silicon-containing layer containing chlorine may be an adsorption layer (physical adsorption layer or chemical adsorption layer) of the DCS or the $SiH_xCl_y$, or may be a deposition layer of silicon containing chlorine. In the present specification, the silicon-containing layer containing chlorine may also be simply referred to as a "silicon-containing layer".

After the first layer is formed on the surface of the wafer 200, the valve 243a is closed to stop the supply of the DCS gas into the process chamber 201. Then, a substance such as a residual gas in the process chamber 201 is removed from the process chamber 201 by vacuum-exhausting the inner atmosphere of the process chamber 201. When removing the substance such as the residual gas, with the valves 243d and 243e open, the $N_2$ gas is supplied into the process chamber 201. The $N_2$ gas serves as the purge gas.

Instead of the DCS gas, for example, a chlorosilane-based gas such as monochlorosilane ($SiH_3Cl$, abbreviated as MCS) gas, trichlorosilane ($SiHCl_3$, abbreviated as TCS) gas, tetrachlorosilane ($SiCl_4$, abbreviated as STC) gas, hexachlorodisilane gas ($Si_2Cl_6$, abbreviated as HCDS) gas and octachlorotrisilane ($Si_3Cl_8$, abbreviated as OCTS) gas may be used as the source gas. For example, a gas such as tetrafluorosilane ($SiF_4$) gas, tetrabromosilane ($SiBr_4$) gas and tetraiodide silane ($SiI_4$) gas may be used as the source gas. That is, a halosilane-based gas such as the chlorosilane-based gas, a fluorosilane-based gas, a bromosilane-based gas and an iodine silane-based gas may be used as the source gas.

Instead of the $N_2$ gas, for example, a rare gas such as argon (Ar) gas, helium (He) gas, neon (Ne) gas and xenon (Xe) gas may be used as the purge gas. The same also applies to the step B and the step C described later.

<Step B>

After the step A is completed, the $H_2$ gas exited by the plasma is supplied to the wafer 200 in the process chamber 201 (that is, to the first layer formed on the wafer 200).

Specifically, while applying the high frequency power between the rod-shaped electrodes 269 and 270, the valves 243b, 243d and 243e are controlled in the same manner as the valves 243a, 243d and 243e in the step A. A flow rate of the $H_2$ gas is adjusted by the MFC 241b. Then, the $H_2$ gas whose flow rate is adjusted is supplied into the process chamber 201 through the nozzle 249b and the buffer structure 237, and is exhausted through the exhaust pipe 231. Thereby, the $H_2$ gas exited by the plasma is supplied to the wafer 200. The $H_2$ gas is excited (or activated) by the plasma when the $H_2$ gas passes through the buffer chamber 237. Thereby, an active species such as $H_2^*$ is generated, and the active species is supplied to the wafer 200. In the present specification, the $H_2$ gas exited by the plasma may also be simply referred to as "$H_2^*$ gas".

For example, process conditions of the step B are as follows:

A supply flow rate of the $H_2$ gas: from 100 sccm to 10,000 sccm, preferably from 1,000 sccm to 10,000 sccm;

The high frequency power $R_H$: from 50 W to 1,000 W;

The supply time (time duration) $T_H$ of supplying $H_2$ gas: from 60 seconds to 240 seconds, or from 20 seconds to 120 seconds; and A process pressure: from 1 Pa to 100 Pa, preferably from 1 Pa to 50 Pa.

The other process conditions are the same as the process conditions of the step A described above. In addition, the supply time $T_H$ of the $H_2$ gas in the step B is set to be longer than the supply time $T_N$ of the $NH_3$ gas in the step C.

By supplying the $H_2^*$ gas to the wafer 200 under the process conditions described above, at least a part of the first layer formed on the wafer 200 in the step A is modified. Specifically, the first layer is shrunk by desorbing impurities such as chlorine contained in the first layer from the first layer and densifying the silicon-containing layer from which the impurities are desorbed. By modifying the first layer, a silicon-containing layer whose impurity concentration is lower than that of the first layer and whose density is higher than that of the first layer is formed on the wafer 200 as the second layer. The second layer contains a tensile stress generated by the shrink of the first layer. An internal stress (that is, the tensile stress) contained in the second layer is greater than an internal stress contained in the first layer.

After the second layer is formed on the wafer 200, the application of the high frequency power between the rod-shaped electrodes 269 and 270 is stopped, and the valve 243b is closed to stop the supply of the $H_2$ gas into the process chamber 201. Then, a substance such as the residual gas in the process chamber 201 is removed from the process chamber 201 in the same manner as in the step A described above.

Instead of the H$_2$ gas, for example, a gas containing hydrogen and free of nitrogen such as deuterium (D$_2$) gas may be used as the first modification gas.

<Step C>

After the step B is completed, the NH$_3$ gas exited by the plasma is supplied to the wafer 200 in the process chamber 201 (that is, to the second layer formed on the wafer 200).

Specifically, while applying the high frequency power between the rod-shaped electrodes 269 and 270, the valves 243c, 243d and 243e are controlled in the same manner as the valves 243a, 243d and 243e in the step A. A flow rate of the NH$_3$ gas is adjusted by the MFC 241c. Then, the NH$_3$ gas whose flow rate is adjusted is supplied into the process chamber 201 through the nozzle 249b and the buffer structure 237, and is exhausted through the exhaust pipe 231. Thereby, the NH$_3$ gas exited by the plasma is supplied to the wafer 200. The NH$_3$ gas is excited (or activated) by the plasma when the NH$_3$ gas passes through the buffer chamber 237. Thereby, an active species such as NH$_3$* is generated, and the active species is supplied to the wafer 200. In the present specification, the NH$_3$ gas exited by the plasma may also be simply referred to as "NH$_3$* gas".

For example, process conditions of the step C are as follows:

A supply flow rate of the NH$_3$ gas: from 100 sccm to 10,000 sccm;

The high frequency power R$_N$: from 50 W to 1,000 W;

The supply time (time duration) T$_N$ of supplying NH$_3$ gas: from 1 second to 120 seconds, preferably from 1 second to 60 seconds; and A process pressure: from 1 Pa to 200 Pa, preferably from 1 Pa to 100 Pa.

The other process conditions are the same as the process conditions of the step A described above. In addition, the supply time T$_N$ of the NH$_3$ gas in the step C is set to be shorter than the supply time T$_H$ of the H$_2$ gas in the step B.

By supplying the NH$_3$* gas to the wafer 200 under the process conditions described above, at least a part of the second layer formed on the wafer 200 in the step B is modified (nitrided). By nitriding the second layer, a silicon nitride layer (also referred to as an "SiN layer") containing silicon and nitrogen is formed on the wafer 200 as the third layer. When the third layer is formed, a small amount of the impurities such as chlorine remaining in the second layer are separated from the second layer. In the step C, the second layer is modified into the SiN layer while nitrogen atoms contained in the NH$_3$* gas are bonded to the second layer. Therefore, in the step C, unlike the step B in which the first layer is modified such that the impurities such as chlorine are desorbed from the first layer by the H$_2$* gas without containing atoms constituting the second layer, the second layer hardly shrinks when the second layer is modified. In addition, the internal stress contained in the second layer (that is, the tensile stress contained in the second layer) due to the shrink of the first layer remains in the third layer without being released. Therefore, an internal stress (tensile stress) contained in the third layer is maintained greater than the internal stress contained in the first layer.

After the third layer is formed on the wafer 200, the application of the high frequency power between the rod-shaped electrodes 269 and 270 is stopped, and the valve 243c is closed to stop the supply of the NH$_3$ gas into the process chamber 201. Then, a substance such as the residual gas in the process chamber 201 is removed from the process chamber 201 in the same manner as in the step A described above.

Instead of the NH$_3$ gas, for example, a hydrogen nitride-based gas such as diazene (N$_2$H$_2$) gas, hydrazine (N$_2$H$_4$) gas and N$_3$H$_8$ gas may be used as the second modification gas.

<Performing Predetermined Number of Times>

By performing the cycle wherein the step A, the step B and the step C described above are performed non-simultaneously (that is, alternately without overlapping with one another) in this order a predetermined number of times (n times, n is an integer equal to or greater than 1), it is possible to form the SiN film of a predetermined composition and a predetermined thickness on the wafer 200. It is preferable that the cycle is performed a plurality of times. That is, it is preferable that the cycle is repeatedly performed the plurality of times until the SiN film of a desired thickness is obtained by controlling the SiN layer formed in each cycle to be thinner than the SiN film of the desired thickness and by stacking the SiN layer by repeatedly performing the cycle.

<After-Purge Step and Returning to Atmospheric Pressure Step>

After the film-forming step is completed, the N$_2$ gas serving as the purge gas is supplied into the process chamber 201 through each of the gas supply pipes 232d and 232e, and then is exhausted through the exhaust pipe 231. Thereby, the process chamber 201 is purged with the N$_2$ gas such that the residual gas or reaction by-products remaining in the process chamber 201 are removed from the process chamber 201 (after-purge step). Thereafter, the inner atmosphere of the process chamber 201 is replaced with an inert gas such as the N$_2$ gas (substitution by inert gas), and the inner pressure of the process chamber 201 is returned to the atmospheric pressure (returning to atmospheric pressure step). While performing the after-purge step through the returning to atmospheric pressure step, the temperature of the wafer 200 is lowered to a second temperature lower than the first temperature (which is a film-forming temperature) described above. For example, the second temperature is set to a predetermined temperature within a range from the normal temperature to 200° C. In the present specification, a step of lowering the temperature of the wafer 200 to the second temperature lower than the first temperature is also referred to as a "temperature lowering step".

<Boat Unloading and Wafer Discharging Step>

Thereafter, the seal cap 219 is lowered by the boat elevator 115 and the lower end of the manifold 209 is opened. Then, the boat 217 with the processed wafers 200 charged therein is unloaded (transferred) out of the reaction tube 203 through the lower end of the manifold 209 (boat unloading step). After the boat 217 is unloaded out of the reaction tube 203, the processed wafers 200 are discharged from the boat 217 (wafer discharging step).

(3) Effects According to Present Embodiments

According to the present embodiments described above, it is possible to obtain one or more among the following effects.

(a) According to the present embodiments, by performing the step B of forming the second layer by modifying the first layer by supplying the H$_2$* gas to the wafer 200 in the process chamber 201 and the step C of forming the third layer by modifying the second layer by supplying the NH$_3$* gas to the wafer 200 in the process chamber 201, it is possible to form the SiN film formed on the wafer 200 with a low concentration of the impurities such as chlorine. That is, it is possible to improve a quality of the SiN film formed on the wafer 200.

(b) According to the present embodiments, when the temperature of the wafer 200 is lowered after the film-forming step (that is, when the film-forming step and the temperature lowering step are sequentially performed), it is possible to reduce the stress generated in the SiN film formed on the wafer 200. The reason why the stress is reduced will be described with reference to FIGS. 5A through 5C.

Figure 5A:
FIG. 5A is a diagram schematically illustrating a substrate before a film-forming step is performed.

FIG. 5A is a diagram schematically illustrating the wafer 200 heated to the first temperature before the film-forming step is performed. The wafer 200 heated to the first temperature is thermally expanded by a predetermined amount along a creeping direction thereof. As shown in FIG. 5A, the wafer 200 heated to the first temperature is hardly or not warped before the film-forming step is performed.

Figure 5B:
FIG. 5B is a diagram schematically illustrating the substrate during the film-forming step.

FIG. 5B is a diagram schematically illustrating the wafer 200 during the film-forming step. As described above, the SiN film formed on the wafer 200 by sequentially performing the step A through the step C contains the tensile stress along the creeping direction thereof by shrinking. That is, by the SiN film to be shrunk, a force is applied to the wafer 200 such that a central portion of a film-forming surface of the wafer 200 is recessed with respect to an outer peripheral portion of the film-forming surface of the wafer 200, that is, the central portion of the film-forming surface (main surface) on which the SiN film is formed is recessed and curved in a spherical shape to warp. On the other hand, since the wafer 200 repels the force that causes the central portion of the film-forming surface to warp, the tensile stress corresponding to the force is generated in the SiN film.

Figure 5C:
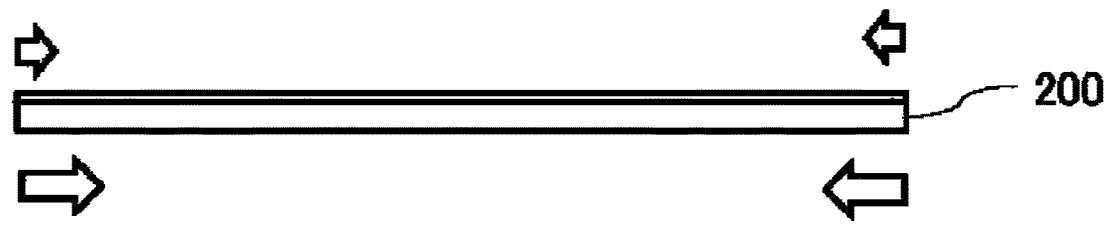
FIG. 5C is a diagram schematically illustrating the substrate after the film-forming step is performed and a temperature of the substrate is lowered.

FIG. 5C is a diagram schematically illustrating the wafer 200 after the film-forming step is performed and the temperature of the wafer 200 is lowered to the second temperature lower than the first temperature. When the temperature of the wafer 200 is lowered to the second temperature lower than the first temperature, the wafer 200 thermally expanded by being heated to the first temperature and the SiN film formed on an upper surface thereof will be gradually shrunk as the temperature is lowered.

When the wafer 200 is shrunk, a shrinkage amount of the SiN film with a low concentration of the impurities formed according to the present embodiments is smaller than a shrinkage amount of the wafer 200. Therefore, a compressive stress is generated in the SiN film after the temperature lowering step since the wafer 200 tends to be shrunk more than the SiN film. As a result, according to the present embodiments, the tensile stress generated in the SiN film in the film-forming step is gradually released (relieved) during the temperature lowering step. In addition, after the tensile stress is completely released, the stress generated in the SiN film changes such that the compressive stress gradually increases. In other words, according to the present embodiments, the compressive stress increased during the temperature lowering step is canceled by the compressive stress generated in the film-forming step. Thereby, the compressive stress generated in the SiN film after the temperature lowering step is relieved (reduced) by a magnitude of the tensile stress which has been generated in the film-forming step. In particular, by making the magnitude of the tensile stress close to a magnitude of the compressive stress, it is possible to minimize the stress generated in the SiN film after the temperature lowering step.

According to the present embodiments, the longer the supply time $T_H$ of the $H_2$ gas ($H_2$* gas) in the step B (that is, the greater the energy applied to the first layer by supplying the $H_2$* gas in the step B), the more the shrinkage amount of the SiN film in the film-forming step. As a result, the tensile stress generated in the SiN film also increases. Further, the shrinkage amount of the SiN film due to the temperature lowering generally decreases as the concentration of the impurities contained in the SiN film is low and the quality of the film is high. Therefore, the larger the supply time $T_N$ of the $NH_3$ gas ($NH_3$* gas) in the step C and the lower the concentration of the impurities contained in the SiN film, the smaller the shrinkage amount of the SiN film after the temperature lowering step. As a result, the compressive stress generated in the SiN film due to a difference in the shrinkage amount of the wafer 200 tends to increase.

Therefore, by making the supply time $T_N$ of the $NH_3$* gas in the step C relatively shorter than the supply time $T_H$ of the $H_2$* gas in the step B, the above-described effect of reducing the stress generated in the SiN film after the temperature lowering step is remarkably obtained. Specifically, it is possible to obtain the above-described effect by making the supply time $T_H$ of the $H_2$* gas in the step B longer than the supply time $T_N$ of the $NH_3$* gas in the step C.

Further, for example, it is possible to obtain the effect described above by adjusting a ratio of $T_H$ to $T_N$ ($T_H/T_N$) such that a magnitude of a compressive stress S generated in the SiN film in a first state where the film-forming step (also referred to as a "first film-forming step) is performed and the temperature lowering step is performed after the film-forming step is smaller than a magnitude of a compressive stress $S_x$ generated in an SiN film "X" in a second state where the SiN film X is formed on the wafer 200 by performing a second film-forming step in which a cycle including the step A and the step C without including the step B is performed the predetermined number of times (n times) and the temperature lowering step is performed after the second film-forming step.

In other words, a value of the ratio $T_H/T_N$ is adjusted such that a shrinkage amount of the SiN film generated by performing the step B (and before the temperature lowering step is performed) is greater than a decrease in a shrinkage amount of the SiN film generated by performing the temperature lowering step after performing the step C. That is, the value of the ratio $T_H/T_N$ is set such that a magnitude of the tensile stress generated in the SiN film by performing the step B (and before the temperature lowering step is performed) is greater than an increase in a magnitude of the compressive stress generated in the SiN film by performing the temperature lowering step after performing the step C.

In addition, it is also possible to obtain the effect described above by continuously supplying the $H_2$* gas in the step B such that the magnitude of the compressive stress S generated in the SiN film in the first state where the first film-forming step is performed and the temperature lowering step is performed after the first film-forming step is smaller than the magnitude of the compressive stress $S_x$ generated in the SiN film X in the second state where the SiN film X is formed on the wafer 200 by performing the second film-forming step in which the cycle including the step A and the step C without including the step B is performed the predetermined number of times (n times) and the temperature lowering step is performed after the second film-forming step.

In other words, the $H_2$* gas in the step B is continuously supplied until the shrinkage amount of the SiN film generated by performing the step B (and before the temperature lowering step is performed) is greater than the decrease in the shrinkage amount of the SiN film generated by performing the temperature lowering step after performing the step C. That is, the $H_2$* gas in the step B is continuously supplied until the magnitude of the tensile stress generated in the SiN film by performing the step B (and before the temperature lowering step is performed) is greater than the increase in the magnitude of the compressive stress generated in the SiN film by performing the temperature lowering step after performing the step C.

The value of the ratio $T_H/T_N$ can be selected from a numerical range in which the magnitude of the compressive stress S described above decreases as the value increases. When the value of the ratio $T_H/T_N$ is less than one (1), it is difficult to obtain the effect described above. Further, when the value of the ratio $T_H/T_N$ is 2.5 or less, the effect described above may not be obtained. By setting the value of the ratio $T_H/T_N$ to be more than 2.5, it is possible to reliably obtain the effect described above. An upper limit of the value of the ratio $T_H/T_N$ is not particularly limited. However, when the step B is performed until the value of the ratio $T_H/T_N$ is more than 10, the effect described above tends to be saturated. In order to avoid wasting the gas and reducing the productivity, it is preferable that the value of the ratio $T_H/T_N$ is set to be 10 or less.

(c) According to the present embodiments, since the first temperature is set to be a temperature of 450° C. or higher, it is possible to obtain the SiN film with a low concentration of the impurities and with an excellent quality as compared with an SiN film formed on the wafer 200 under a temperature condition of less than 450° C. Therefore, according to the present embodiments, by setting the first temperature to a temperature of 450° C. or higher, it is possible to form the SiN film with the excellent quality as compared with the SiN film formed on the wafer 200 under the temperature condition of less than 450° C., and it is also possible to reduce the compressive stress generated in the film with an excellent quality after the temperature lowering step.

(d) According to the present embodiments, since the first temperature is set to be a temperature lower than 700° C., it is possible to reduce a thermal history of the wafer 200.

(e) It is also possible to obtain the same effects described above when a gas containing silicon and a halogen element gas is used as the source gas instead of the DCS gas, when a gas containing hydrogen and free of nitrogen is used as the first modification gas instead of the $H_2$ gas, or when a gas containing nitrogen and hydrogen is used as the second modification gas instead of the $NH_3$ gas.

(4) Modified Examples

The embodiments described above can be modified as shown in the following modified examples. The modified examples described below may be combined appropriately.

First Modified Example

In addition to adjusting the ratio $T_H/T_N$ or instead of adjusting the ratio $T_H/T_N$, by adjusting (or increasing) a ratio of the high frequency power $R_H$ to the high frequency power $R_N$ ($R_H/R_N$), it is possible to reduce the stress generated in the SiN film formed on the wafer 200 when the film-forming step and the temperature lowering step are sequentially performed.

That is, it is possible to obtain the effects described above by adjusting (or increasing) the ratio of $R_H$ to $R_N$ ($R_H/R_N$) such that the magnitude of the compressive stress S generated in the SiN film in the first state where the first film-forming step is performed and the temperature lowering step is performed after the first film-forming step is smaller than the magnitude of the compressive stress $S_x$ generated in the SiN film X in the second state where the SiN film X is formed on the wafer 200 by performing the second film-forming step in which the cycle including the step A and the step C without including the step B is performed the predetermined number of times (n times) and the temperature lowering step is performed after the second film-forming step. Further, when a value of the ratio $R_H/R_N$ is 0.5 or less, the effects described above may not be obtained. By setting the value of the ratio $R_H/R_N$ to be more than 0.5, it is possible to reliably obtain the effects described above. It is considered that, this is because, by adjusting a magnitude of $R_H$ in the step B as described above, it is possible to increase the energy applied to the first layer by the $H_2^*$. Thereby, it is also possible to increase a modifying action due to the $H_2^*$.

Second Modified Example

In addition to adjusting the ratio $T_H/T_N$ or instead of adjusting the ratio $T_H/T_N$, by adjusting (or decreasing) the inner pressure of the process chamber 201 in the step B of the film-forming step, it is possible to reduce the stress generated in the SiN film formed on the wafer 200 when the film-forming step and the temperature lowering step are sequentially performed.

That is, it is possible to obtain the effects described above by adjusting (or decreasing) the inner pressure of the process chamber 201 in the step B such that the magnitude of the compressive stress S generated in the SiN film in the first state where the first film-forming step is performed and the temperature lowering step is performed after the first film-forming step is smaller than the magnitude of the compressive stress $S_x$ generated in the SiN film X in the second state where the SiN film X is formed on the wafer 200 by performing the second film-forming step in which the cycle including the step A and the step C without including the step B is performed the predetermined number of times (n times) and the temperature lowering step is performed after the second film-forming step. It is considered that, this is because, by adjusting the inner pressure of the process chamber 201 in the step B as described above, it is possible to extend a lifetime of the $H_2^*$ and to increase the energy applied to the first layer by the $H_2^*$. Thereby, it is also possible to increase the modifying action due to the $H_2^*$.

Third Modified Example

As described above, the film-forming step is performed while the wafers 200 horizontally oriented with their centers aligned with one another in a multistage manner are arranged in the process chamber 201. In addition to adjusting the ratio $T_H/T_N$ or instead of adjusting the ratio $T_H/T_N$, by adjusting the interval (pitch) between adjacent wafers among the wafers 200 arranged in a multistage manner, it is possible to reduce the stress generated in the SiN film formed on the wafer 200 when the film-forming step and the temperature lowering step are sequentially performed.

For example, in case the film-forming step is performed, it is possible to obtain the effects described above by setting the interval between adjacent wafers among the wafers 200 arranged in a multistage manner to be greater than 7.5 mm, preferably 10 mm or more. It is considered that, this is because, by adjusting the interval between adjacent wafers among the wafers 200 arranged in a multistage manner as described above, it is possible to extend the lifetime of the $H_2^*$. Thereby, it is also possible to increase the modifying action due to the $H_2^*$. An upper limit of the interval between adjacent wafers among the wafers 200 is not particularly limited. However, in order to avoid a reduction in the productivity of the substrate processing, it is preferable that the interval is set to be 30 mm or less, preferably 15 mm or less.

Examples of Embodiments

The SiN film is formed on the wafer 200 by using the substrate processing apparatus shown in FIGS. 1 through 3 for each of a first example (example "#1" in FIG. 6), a second example (example "#2" in FIG. 6) and a third example (example "#3" in FIG. 6). The supply time $T_H$ of the $H_2^*$ gas in the step B, the supply time $T_N$ of the $NH_3^*$ gas in the step C and the ratio $T_H/T_N$ of each of the first example, the second example and the third example are set as shown in FIG. 6. For each of the first example, the second example and the third example, the other process conditions such as the number of times of performing the cycle, the process pressure and the high frequency power are set in common within the ranges thereof in the embodiments described above.

For each of the first example, the second example and the third example, the stress generated in the SiN film formed on the wafer 200 after the temperature lowering step is measured, and measurement results are shown in FIG. 6. From the measurement results, it is confirmed that, when the ratio $T_H/T_N$ is more than 2.5, it is possible to obtain the effect of reducing the stress of the SiN film described above, and when the ratio $T_H/T_N$ is more than 3.5, it is possible to reliably obtain the effect described above. In addition, it is also confirmed that, as the ratio $T_H/T_N$ increases, the effect described above increases.

Further, the SiN film is formed on the wafer 200 by using the substrate processing apparatus shown in FIGS. 1 through 3 for each of a fourth example (example "#4" in FIG. 7) and a fifth example (example "#5" in FIG. 7). The high frequency power $R_H$ in the step B, the high frequency power $R_N$ in the step C and the ratio $R_H/R_N$ of each of the fourth example and the fifth example are set as shown in FIG. 7. For each of the fourth example and the fifth example, the other process conditions such as the number of times of performing the cycle, the process pressure and the supply time of each gas are set in common within the ranges thereof in the embodiments described above.

For each of the fourth example and the fifth example, the stress generated in the SiN film formed on the wafer 200 after the temperature lowering step is measured, and measurement results are shown in FIG. 7. From the measurement results, it is confirmed that, when the ratio $R_H/R_N$ is more than 0.5, it is possible to obtain the effect of reducing the stress of the SiN film described above, and when the ratio $R_H/R_N$ is more than 1, it is possible to reliably obtain the effect described above. In addition, it is also confirmed that, as the ratio $R_H/R_N$ increases, the effect described above increases.

<Other Embodiments According to Technique of Present Disclosure>

While the technique of the present disclosure is described in detail by way of the embodiments described above, the technique of the present disclosure is not limited thereto. The technique of the present disclosure may be modified in various ways without departing from the scope thereof.

For example, the technique of the present disclosure may also be preferably applied to form a nitride film (a metal nitride film) containing a metal element as a main element. For example, the metal nitride film may contain the metal element such as titanium (Ti), zirconium (Zr), hafnium (Hf), tantal (Ta), niobium (Nb), molybdenum (Mo), tungsten (W), yttrium (Y), strontium (Sr), lanthanum (La), ruthenium (Ru) and aluminum (Al).

For example, the technique of the present disclosure may also be preferably applied to form the metal nitride film such as a titanium nitride film (TiN film), a hafnium nitride film (HfN film), a tantalum nitride film (TaN film) and a aluminum nitride film (AlN film) on the wafer 200 by film-forming sequences described below using a gas such as titanium tetrachloride ($TiCl_4$) gas, hafnium tetrachloride ($HfCl_4$) gas, tantalum pentachloride ($TaCl_5$) gas and trimethylaluminum ($Al(CH_3)_3$, abbreviated as TMA) gas as the source gas.

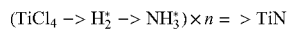
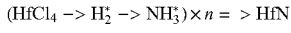
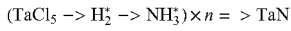

The process sequence and the process conditions for forming the films described above may be substantially the same as those of the embodiments or the modified examples described above. Even in such a case, the same effects according to the embodiments or the modified examples described above may also be obtained similarly. That is, the technique of the present disclosure may also be preferably applied to form a metalloid nitride film containing a metalloid element such as silicon as a main element, or to form the metal nitride film containing the metal element described above as a main element.

For example, recipes used in the substrate processing may be preferably prepared individually according to the process contents and stored in the memory 121c via an electric communication line or the external memory 123. When starting the substrate processing, preferably, the CPU 121a is configured to select an appropriate recipe among the recipes stored in the memory 121c according to the process contents. Thus, various films of different composition ratios, qualities and thicknesses may be formed in a reproducible manner by using a single substrate processing apparatus. In addition, since the burden on an operator of the substrate processing apparatus may be reduced, various processes may be performed quickly while avoiding a malfunction of the substrate processing apparatus.

The above-described recipe is not limited to creating a new recipe. For example, the recipe may be prepared by changing an existing recipe stored in the substrate processing apparatus in advance. When changing the existing recipe to a new recipe, the new recipe may be installed in the substrate processing apparatus via the electric communication line or the recording medium in which the new recipe is stored. In addition, the existing recipe already stored in the substrate processing apparatus may be directly changed to the new recipe by operating the input/output device 122 of the substrate processing apparatus.

For example, the above-described embodiments are described by way of an example in which a batch type substrate processing apparatus configured to simultaneously process a plurality of substrates is used to form the film. However, the technique of the present disclosure is not limited thereto. For example, the technique of the present disclosure may be preferably applied when a single wafer type substrate processing apparatus configured to simultaneously process one or several substrates is used to form the film. For example, the above-described embodiments are described by way of an example in which a substrate processing apparatus including a hot wall type process furnace is used to form the film. However, the technique of the present disclosure is not limited thereto. For example, the technique of the present disclosure may be preferably applied when a substrate processing apparatus including a cold wall type process furnace is used to form the film.

The process sequence and the process conditions of the substrate processing using the substrate processing apparatuses described above may be substantially the same as those of the embodiments or the modified examples described above. Even in such a case, the same effects according to the embodiments or the modified examples described above may also be obtained similarly.

The embodiments described above and the modified examples described above may be appropriately combined. In addition, the process sequence and the process conditions of each combination thereof may be substantially the same as those of the embodiments or the modified examples described above.

According to some embodiments of the present disclosure, it is possible to improve the quality of the nitride film formed on the substrate and to reduce the stress generated in the nitride film after the film-forming process.

What is claimed is:

1. A method of manufacturing a semiconductor device, comprising
   (A) forming a film containing a predetermined element and nitrogen on a substrate by performing a cycle a predetermined number of times,
   wherein the cycle comprises:
   (a) forming a first layer by supplying a source gas containing the predetermined element and a halogen element to the substrate heated to a first temperature in a process chamber;
   (b) forming a second layer by modifying the first layer by supplying a first modification gas containing hydrogen free of nitrogen and exited by plasma to the substrate in the process chamber; and
   (c) forming a third layer by modifying the second layer by supplying a second modification gas containing nitrogen and hydrogen and exited by plasma to the substrate in the process chamber, and
   wherein a supply time $T_H$ of supplying the first modification gas in (b) is set to be longer than a supply time $T_N$ of supplying the second modification gas in (c).

2. The method of claim 1, further comprising
   (B) lowering a temperature of the substrate to a second temperature lower than the first temperature,
   wherein a ratio $T_H/T_N$ of the supply time $T_H$ to the supply time $T_N$ is adjusted such that a magnitude of a compressive stress S generated in the film in a state where (A) and (B) are sequentially performed is smaller than a magnitude of a compressive stress $S_x$ generated in a comparative film X in a state where (B) is performed after the comparative film X is formed by performing the predetermined number of times of a cycle comprising (a) and (c) without comprising (b).

3. The method of claim 2, wherein a value of the ratio $T_H/T_N$ is adjusted such that a shrinkage amount of the film generated by performing (b) is greater than a decrease in a shrinkage amount of the film generated by performing (c) and (B).

4. The method of claim 2, wherein, the value of the ratio $T_H/T_N$ is selected from a numerical range in which the magnitude of the compressive stress decreases as the value increases.

5. The method of claim 2, wherein the value of the ratio $T_H/T_N$ is greater than 2.5.

6. The method of claim 1, further comprising
   (B) lowering a temperature of the substrate to a second temperature lower than the first temperature,
   wherein the first modification gas is continuously supplied in (b) such that a magnitude of a compressive stress S generated in the film in a state where (A) and (B) are sequentially performed is smaller than a magnitude of a compressive stress $S_x$ generated in a comparative film X in a state where (B) is performed after the comparative film X is formed by performing the predetermined number of times of a cycle comprising (a) and (c) without comprising (b).

7. The method of claim 6, wherein the first modification gas is continuously supplied in (b) until a shrinkage amount of the film generated by performing (b) is greater than a decrease in a shrinkage amount of the film generated by performing (c) and (B).

8. The method of claim 1, wherein the first layer in (a) comprises a layer containing the predetermined element and the halogen element, the second layer in (b) is formed by desorbing the halogen element from the first layer, and the third layer in (c) is formed by nitriding the second layer.

9. The method of claim 1, further comprising
   (B) lowering a temperature of the substrate to a second temperature lower than the first temperature,
   wherein the first modification gas is excited by the plasma by applying high frequency power $R_H$ to the first modification gas in (b), and the second modification gas is excited by the plasma by applying high frequency power $R_N$ to the second modification gas in (c), and
   wherein a ratio $R_H/R_N$ of the high frequency power $R_H$ to the high frequency power $R_N$ is adjusted such that a magnitude of a compressive stress S generated in the film in a state where (A) and (B) are sequentially performed is smaller than a magnitude of a compressive stress $S_x$ generated in a comparative film X in a state where (B) is performed after the comparative film X is formed by performing the predetermined number of times of a cycle comprising (a) and (c) without comprising (b).

10. The method of claim 9, wherein a value of the ratio $R_H/R_N$ is greater than 0.5.

11. The method of claim 1, further comprising
    (B) lowering a temperature of the substrate to a second temperature lower than the first temperature,
    wherein an inner pressure of the process chamber is adjusted such that such that a magnitude of a compressive stress S generated in the film in a state where (A) and (B) are sequentially performed is smaller than a magnitude of a compressive stress $S_x$ generated in a comparative film X in a state where (B) is performed after the comparative film X is formed by performing the predetermined number of times of a cycle comprising (a) and (c) without comprising (b).

12. A substrate processing method comprising:
    (A) forming a film containing a predetermined element and nitrogen on a substrate by performing a cycle a predetermined number of times, wherein the cycle comprises:
- (a) forming a first layer by supplying a source gas containing the predetermined element and a halogen element to the substrate heated to a first temperature in a process chamber;
- (b) forming a second layer by modifying the first layer by supplying a first modification gas containing hydrogen free of nitrogen and exited by plasma to the substrate in the process chamber; and
- (c) forming a third layer by modifying the second layer by supplying a second modification gas containing nitrogen and hydrogen and exited by plasma to the substrate in the process chamber, and wherein a supply time $T_H$ of supplying the first modification gas in (b) is set to be longer than a supply time $T_N$ of supplying the second modification gas in (c).

13. A non-transitory computer-readable recording medium storing a program that causes, by a computer, a substrate processing apparatus to perform:
- (A) forming a film containing a predetermined element and nitrogen on a substrate by performing a cycle a predetermined number of times, wherein the cycle comprises:
- (a) forming a first layer by supplying a source gas containing the predetermined element and a halogen element to the substrate heated to a first temperature in a process chamber;
- (b) forming a second layer by modifying the first layer by supplying a first modification gas containing hydrogen free of nitrogen and exited by plasma to the substrate in the process chamber; and
- (c) forming a third layer by modifying the second layer by supplying a second modification gas containing nitrogen and hydrogen and exited by plasma to the substrate in the process chamber, and wherein a supply time $T_H$ of supplying the first modification gas in (b) is set to be longer than a supply time $T_N$ of supplying the second modification gas in (c).

14. A substrate processing apparatus comprising:
- a process chamber in which a substrate is processed;
- a heater configured to heat the substrate in the process chamber;
- a source gas supplier through which a source gas containing a predetermined element and a halogen element is supplied to the substrate in the process chamber;
- a first modification gas supplier through which a first modification gas containing hydrogen free of nitrogen is supplied to the substrate in the process chamber;
- a second modification gas supplier through which a second modification gas containing nitrogen and hydrogen is supplied to the substrate in the process chamber;
- a plasma exciter configured to activate each of the first modification gas and the second modification gas into a plasma state; and
- a controller configure to be capable of controlling the heater, the source gas supplier, the first modification gas supplier, the second modification gas supplier and the plasma exciter to perform (A) forming a film containing the predetermined element and nitrogen on the substrate by performing a cycle a predetermined number of times, wherein the cycle comprises:
- (a) forming a first layer by supplying the source gas to the substrate heated to a first temperature in the process chamber;
- (b) forming a second layer by modifying the first layer by supplying the first modification gas exited by plasma to the substrate in the process chamber; and
- (c) forming a third layer by modifying the second layer by supplying the second modification gas exited by plasma to the substrate in the process chamber, and wherein a supply time $T_H$ of supplying the first modification gas in (b) is set to be longer than a supply time $T_N$ of supplying the second modification gas in (c).

* * * * *